United States Patent
Tsukamoto et al.

(10) Patent No.: US 6,888,072 B2
(45) Date of Patent: May 3, 2005

(54) FIXTURE, CIRCUIT BOARD WITH FIXTURE, AND ELECTRONIC-COMPONENT MOUNTED BODY AND METHOD OF MANUFACTURING THE SAME

(75) Inventors: Masahide Tsukamoto, Nara (JP); Kazufumi Yamaguchi, Osaka (JP); Takeshi Shimamoto, Osaka (JP); Fumikazu Tateishi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 17 days.

(21) Appl. No.: 09/810,846

(22) Filed: Mar. 16, 2001

(65) Prior Publication Data

US 2001/0027876 A1 Oct. 11, 2001

(30) Foreign Application Priority Data

Mar. 24, 2000 (JP) ........................................ 2000-084391

(51) Int. Cl.⁷ ................................................ H05K 1/16
(52) U.S. Cl. ........................... 174/260; 29/836; 361/807
(58) Field of Search ............ 29/834–836; 361/807–812, 361/760, 783; 174/260; 257/727

(56) References Cited

U.S. PATENT DOCUMENTS

| | | | | |
|---|---|---|---|---|
| 4,037,270 A | * | 7/1977 | Ahmann et al. | ............. 361/385 |
| 4,728,753 A | * | 3/1988 | Nakano | ................... 174/138 G |
| 5,742,487 A | * | 4/1998 | Kobayashi et al. | ......... 361/809 |
| 6,323,440 B1 | * | 11/2001 | Maruyama et al. | ......... 174/262 |

FOREIGN PATENT DOCUMENTS

| JP | 2-268491 | 11/1990 |
|---|---|---|
| JP | 3-241847 | 10/1991 |

* cited by examiner

Primary Examiner—Kamand Cuneo
Assistant Examiner—Jeremy Norris
(74) Attorney, Agent, or Firm—Merchant & Gould, P.C.

(57) ABSTRACT

A fixture with movable pawls and positioning walls is attached to a circuit board. An electronic component is inserted into the fixture from its upper side. Since the movable pawls move outward due to their slopes, the electronic component is allowed to fit between the positioning walls. After the fitting of the electronic component, the movable pawls hold the sides of the upper face of the electronic component and the positioning walls are in contact with the peripheral walls of the electronic component. Bumps provided on electrode pads of the electronic component are connected to electrodes on the circuit board. Thus, the electronic component can be mounted using the flip chip technique. In addition, the electronic component can be removed easily by moving the movable pawls even after being mounted.

33 Claims, 7 Drawing Sheets

FIXTURE, CIRCUIT BOARD WITH FIXTURE, AND ELECTRONIC-COMPONENT MOUNTED BODY AND METHOD OF MANUFACTURING THE SAME

BACKGROUND OF THE INVENTION

1. Field of the Invention

The present invention relates generally to a fixture for placing various electronic components (for example, a semiconductor bare chip, a ball grid array (BGA), a chip size package (CSP), or the like) on a circuit board. Particularly, the present invention relates to a fixture allowing an electronic component to be mounted easily using a flip chip technique and to be replaced easily. In addition, the present invention relates to a circuit board provided with such a fixture. The present invention also relates to a mounted body with an electronic component mounted using such a fixture and to a method of manufacturing the same.

2. Related Background Art

Recently, with the decrease in size and the increase in density of electronic equipment, there have been demands for flip chip mounting of semiconductor chips such as LSIs in a bare chip state not only in a field of industrial equipment but also extensively in consumer equipment.

In the flip chip mounting, there is a problem in that a semiconductor chip is bonded to a board with a resin adhesive called "an underfill" and therefore, repairs cannot be made once the semiconductor chip has been bonded. This is a hindrance in employing the flip chip mounting technique.

It is necessary for semiconductor chip manufacturers to deliver bare chips removed from circuit boards after the bare chip test or a burn-in test.

At present, there is no fixture practically used that allows a semiconductor chip to be placed on a circuit board in an easily removable manner using the flip chip technique. However, a fixture with a frame for fixing a CSP attached to a board on which contact pins with springs are arranged in a lattice-point form has been used experimentally as a fixture for a CSP in some cases.

JP 2(1990)-268491 A describes a method of replaceably mounting a double-pole chip component provided with electrodes at its both ends. The method is described as follows. Initially, a pair of inclined metal plates are attached to both ends of an insulator plate in a standing state and thus a stand is produced. Next, the stand is fixed onto a circuit board. In this process, a pair of electrodes formed on the circuit board and the pair of inclined metal plates are soldered to be electrically connected to each other, respectively. Then, while the electrodes at both ends of the double-pole chip component are allowed to contact with the pair of inclined metal plates, respectively, the double-pole chip component is held elastically between the pair of inclined metal plates. Thus, the electrodes of the double-pole chip component are electrically connected to the electrodes on the circuit board through the inclined metal plates. According to this method, even after being placed on the circuit board, the double-pole chip component can be removed from the circuit board easily by releasing of the elastic holding by the pair of inclined metal plates.

In addition, JP 3(1991)-241847 A describes a method of mounting a chip component with electrodes formed on its one surface. The method is described as follows. Initially, the electrodes of the chip component are aligned with electrodes on a circuit board, and then the chip component is placed face down on the circuit board. Next, a substantially U-shaped cap is put on the upper face (on which the electrodes are not formed) of the chip component with an elastic body layer interposed therebetween. Then, both foot parts of the cap are bonded to the circuit board. Thus, the chip component is pressed toward the circuit board by the cap with the elastic body layer interposed therebetween. Consequently, the chip component and the circuit board are electrically connected to each other.

However, the above-mentioned conventional mounting methods have the following problems, respectively.

The fixture for a CSP described above has a very large and complicated configuration. Therefore, it can be used for the burn-in test of semiconductor bare chips but cannot be used by any means for general electronic equipment in view of its shape and manufacturing cost. Furthermore, it also is difficult to apply the fixture to semiconductor chips with electrode pads arranged with a narrow pitch.

In the method of mounting a double-pole chip component described in JP 2(1990)-268491 A, the stand is used in which the pair of inclined metal plates are bonded to both ends of the insulator plate to be formed integrally therewith. In order to produce the stand, therefore, it is necessary to form the members made of different materials integrally. This makes the configuration of the stand complicated and thus results in a high manufacturing cost. In addition, the insulator plate is interposed between the chip component and the circuit board, and therefore the electrodes of the chip component and the electrodes on the circuit board are electrically connected to each other through the pair of inclined metal plates. This causes deterioration in properties such as a high frequency property. Furthermore, this mounting method essentially is intended to be used for a double-pole chip component. It, therefore, is difficult to apply the mounting method to the flip chip mounting. In addition, it also is difficult to apply the mounting method to electronic components with a number of electrodes formed with a narrow pitch. Hence, this mounting method is not suitable for a high density mounting.

In the method of mounting a chip component described in JP 3(1991)-241847 A, it is difficult to replace the chip component after the U-shaped cap is bonded to the circuit board. Moreover, the chip component tends to be misaligned with respect to the circuit board in bonding and fixing the cap. Particularly, when the electrodes are arranged with a narrow pitch, the yield decreases considerably.

SUMMARY OF THE INVENTION

The present invention is intended to solve the above-mentioned conventional problems. It is an object of the present invention to provide an inexpensive practical fixture with a simple configuration that enables an electronic component such as a semiconductor bare chip to be placed using the flip chip technique and allows the electronic component to be removed easily even after the electronic component is placed. The present invention also is intended to provide a circuit board with such a fixture. Furthermore, it is another object of the present invention to provide a mounted body with electronic components mounted with such a fixture and a method of manufacturing the same.

In order to achieve the above-mentioned objects, the present invention employs the following configurations.

A fixture according to the present invention includes a base with an opening in its center portion, a movable pawl provided on the base for fixing an electronic component, and at least one pair of positioning walls for positioning the electronic component.

According to the fixture described above, all or part of the four sides and four corners of the electronic component, such as a semiconductor bare chip (synonymous with a semiconductor chip), a BGA, a CSP, or the like, are held by the movable pawl and are allowed to contact with the positioning walls, so that the electronic component can be positioned and fixed. Therefore, when such a fixture is fixed to a circuit board, the electronic component can be mounted on the circuit board using the flip chip technique. In addition, since the electronic component is held by the movable pawl, it can be removed easily even after being mounted. Hence, if a mounting failure occurs, repairs can be made easily. Moreover, the fixture has a simple configuration and can be manufactured at low cost accordingly. Thus, the fixture can be used practically for electronic equipment. Since the base has an opening in its center, the electronic component and the circuit board can be connected directly to each other without using any conductive members (other than bumps, a conductive adhesive, and the like) therebetween. Furthermore, since the fixture is formed in a frame-like form surrounding the periphery of the electronic component, such a fixing member can be handled as one component and thus can be attached and manufactured easily.

In the fixture, preferably, the movable pawl is supported by the base through a thin-wall part having a relatively thin wall thickness so as to be in an elastically displaceable state. This configuration facilitates mounting and removal after the mounting of the electronic component.

In this case, preferably, a wall thickness of the base is thicker than that of the thin-wall part. In this context, the "wall thickness of the base" denotes the wall thickness of the base in a direction parallel to the surface of the circuit board when the fixture is attached to the circuit board. This configuration enlarges the area of the bottom of the base to be bonded to the circuit board and thus increases the strength with which the fixture is attached to the circuit board.

The thin-wall part may have a cross-sectional shape bent or curved in a substantially C-, J-, or V-shaped form. This configuration can ease the range of tolerance in dimensions of the fixture, circuit board, and electronic component. In addition, the electronic component and circuit board can be prevented from being damaged due to an excessive pressing force caused by a minor manufacturing error.

In the fixture, preferably, the base has a substantially rectangular frame-like planar shape with an opening in its center portion. The shape of the fixture is allowed to coincide with the rectangular shape generally employed as a planar shape of electronic components, so that the area of the circuit board occupied by the fixture can be minimized.

In this case, preferably, the movable pawl is formed at least on one side of the four sides excluding four corners. This configuration facilitates the elastic displacement of the movable pawl, so that the electronic component can be mounted easily and removed after being mounted.

In the fixture, it also is preferable that a slope with its lower end located on the opening side is formed on an upper portion of the movable pawl. This facilitates the mounting of the electronic component.

In the fixture, preferably, the positioning walls are inner wall faces of the base. This facilitates the manufacture of the fixture.

An end face of the movable pawl may function as the positioning wall. According to this configuration, the tolerance in dimensions of the positioning walls and electronic component can be eased.

In the fixture, preferably, the movable pawl and the positioning walls are formed of an insulating material. At least the members brought into contact with the electronic component are formed of an insulating material, so that a malfunction of the electronic component and electric circuit can be prevented.

In the fixture, it is preferable that the base, the movable pawl, and the positioning walls are formed integrally using the same material. This enables the fixture to be manufactured at low cost.

Next, a circuit board with a fixture (a circuit board and fixture combination) according to the present invention includes a fixture mounted on a circuit board and used for placing an electronic component on the circuit board. The fixture includes a movable pawl for fixing an electronic component and at least one pair of positioning walls for positioning an electronic component. Electrodes on the circuit board are exposed between the pair of positioning walls.

According to the circuit board with a fixture, all or part of the four sides and four corners of the electronic component, such as a semiconductor bare chip, a BGA, a CSP, or the like, are held by the movable pawl and allowed to contact with the positioning walls, so that the electronic component can be positioned and fixed. Hence, the electronic component can be mounted on the circuit board using the flip chip technique. In addition, since the electronic component is held by the movable pawl, it can be removed easily after being mounted. Consequently, if a mounting failure occurs, repairs can be made easily. Moreover, the fixture has a simple configuration and can be manufactured at low cost accordingly. Thus, the fixture can be used practically for electronic equipment. Since the electrodes on the circuit board are exposed, electrodes of the electronic component can be connected directly to the electrodes on the circuit board without using any conductive members (other than bumps, a conductive adhesive, and the like) therebetween.

In the circuit board with a fixture, preferably, the movable pawl is supported through a thin-wall part having a relatively thin wall thickness so as to be in an elastically displaceable state. This configuration facilitates mounting and removal after the mounting of the electronic component.

In this case, preferably, the fixture is fixed to the circuit board by adhering thereto by its bottom face, and the wall thickness of the fixture at the bottom face is thicker than that of the thin-wall part. This increases the strength with which the fixture is attached to the circuit board.

The thin-wall part may have a cross-sectional shape bent or curved in a substantially C-, J-, or V-shaped form. This configuration can ease the range of tolerance in dimensions of the fixture, circuit board, and electronic component. In addition, the electronic component and circuit board can be prevented from being damaged due to an excessive pressing force caused by a minor manufacturing error.

In the circuit board with a fixture, preferably, the fixture has a substantially rectangular frame-like planar shape with an opening in its center portion. The fixture is formed integrally to surround the periphery of the electronic component, so that the fixture can be handled as one component and thus can be attached and manufactured easily.

In the circuit board with a fixture, preferably, the movable pawl is formed at least on one side of four sides excluding four corners. This configuration facilitates the elastic displacement of the movable pawl, so that the electronic component easily can be mounted and removed after being mounted.

In the circuit board with a fixture, preferably, a slope with its lower end located on the electronic component side is formed on an upper portion of the movable pawl. This facilitates the mounting of the electronic component.

Furthermore, in the circuit board with a fixture, electrodes connected to the electrodes formed on a first surface of the circuit board provided with the fixture may be formed on a second surface of the circuit board opposite to the first surface. This provides a jig for flip chip mounting of an electronic component.

Next, an electronic-component mounted body according to the present invention includes a circuit board with an electronic component placed thereon using a fixture. The fixture includes a movable pawl and at least one pair of positioning walls. The movable pawl fixes the electronic component to the circuit board. The electronic component is placed between the pair of positioning walls, so that the positioning walls control the position of the electronic component in the direction parallel to the surface of the circuit board. Electrodes of the electronic component are connected to electrodes on the circuit board formed between the pair of positioning walls.

According to the electronic-component mounted body, the electronic component, such as a semiconductor bare chip, a BGA, a CSP, or the like, can be mounted on the circuit board using the flip chip technique. In addition, the electronic component is held by the movable pawl and thus can be removed easily even after being mounted. Thus, if a mounting failure occurs, repairs can be made easily. Moreover, the fixture has a simple configuration and thus can be manufactured at low cost. Hence, the fixture can be used practically for electronic equipment. The electrodes of the electronic component can be connected directly to the electrodes on the circuit board without using any conductive members (other than bumps, a conductive adhesive, and the like) therebetween.

In the electronic-component mounted body, preferably, the movable pawl presses the electronic component toward the circuit board. This improves the reliability in the connections between the electrodes of the electronic component and the electrodes on the circuit board.

In the electronic-component mounted body, a semiconductor chip, a BGA, or a CSP can be used as the electronic component.

In the electronic-component mounted body, preferably, the electrodes of the electronic component and the electrodes on the circuit board are connected to each other with a conductive adhesive interposed therebetween. According to this configuration, the electronic component can be mounted even when no bump is formed on the electrodes of both the electronic component and the circuit board. In addition, when bumps are formed, an excellent electrical connection can be established even when some manufacturing error is involved in the bump, circuit board, or the like.

In the electronic-component mounted body, preferably, bumps are formed on the electrodes of the electronic component or on the electrodes on the circuit board. According to this configuration, an electrical connection is established simply by the attachment of the electronic component to the fixture.

In this case, it is preferable that the bumps and the electrodes on which the bumps are not formed are connected to each other with a conductive adhesive interposed therebetween. According to this configuration, the conductive adhesive cancels manufacturing errors in the bumps, circuit board, or the like and thus an excellent electrical connection is established.

In the electronic-component mounted body, preferably, a fixing plate with a larger outer dimension than that of the electronic component is attached to the electronic component, the movable pawl indirectly fixes the electronic component through the fixing plate, and the positioning walls indirectly control the position of the electronic component through the fixing plate. In this context, the term "larger outer dimension" denotes that the fixing plate is larger than the electronic component with respect to the shape projected from the upper side. With this configuration, the fixture can be normalized by the standardization in size of the fixing plate. Consequently, further cost reduction is possible.

In this case, the fixing plate and the positioning walls may be formed to have shapes engaging with each other, and with the shapes, the position of the fixing plate may be controlled and/or the fixing plate may be fixed. This configuration increases the degree of freedom in the design of the fixture.

Furthermore, preferably, a slope is formed at the periphery of a lower face of the fixing plate. This configuration allows the slope to contact with the movable pawl when the electronic component is attached, so that the movable pawl can be moved easily and thus the mounting is facilitated.

In addition, preferably, the fixing plate is attached to the electronic component with an elastic adhesive layer interposed therebetween. According to this configuration, various manufacturing errors can be cancelled by the elastic deformation of the adhesive layer.

Next, a method of manufacturing an electronic-component mounted body according to the present invention includes providing a circuit board provided with a fixture having a movable pawl and at least one pair of positioning walls and with electrodes formed to be exposed between the pair of positioning walls, and connecting electrodes of an electronic component and the electrodes on the circuit board by fitting the electronic component between the pair of positioning walls and fixing the electronic component by the movable pawl.

According to the method of manufacturing an electronic-component mounted body, all or part of the four sides and four corners of the electronic component, such as a semiconductor bare chip, a BGA, a CSP, or the like, are held by the movable pawl and are allowed to contact with the positioning walls, so that the electronic component can be positioned and fixed. Hence, the electronic component can be mounted on the circuit board using the flip chip technique. The exposed electrodes on the circuit board and the electrodes of the electronic component can be connected directly to each other without using any conductive members (other than bumps, a conductive adhesive, and the like) therebetween. In addition, since the electronic component is held by the movable pawl, it can be removed easily even after being mounted. Therefore, if a mounting failure occurs, repairs can be made easily. Moreover, the fixture has a simple configuration and can be manufactured at low cost accordingly. Thus, the fixture can be used practically for electronic equipment.

In the method of manufacturing an electronic-component mounted body, after the electrodes of the electronic component and the electrodes on the circuit board are connected to each other, a continuity test for the connections may be conducted. This makes it possible to judge whether the connection is good or bad. In addition, when a poor connection is found, the electronic component can be removed and repairs can be made.

After the continuity test, an underfill may be injected between the electronic component and the circuit board.

This prevents the connection part from deteriorating due to environmental variations and also increase the mechanical strength of the connection part.

Moreover, after the continuity test, the electronic component may be sealed with resin. According to this, a semiconductor package can be obtained.

DETAILED DESCRIPTION OF THE INVENTION

The present invention is described specifically by means of embodiments as follows.

First Embodiment

Figure 1:
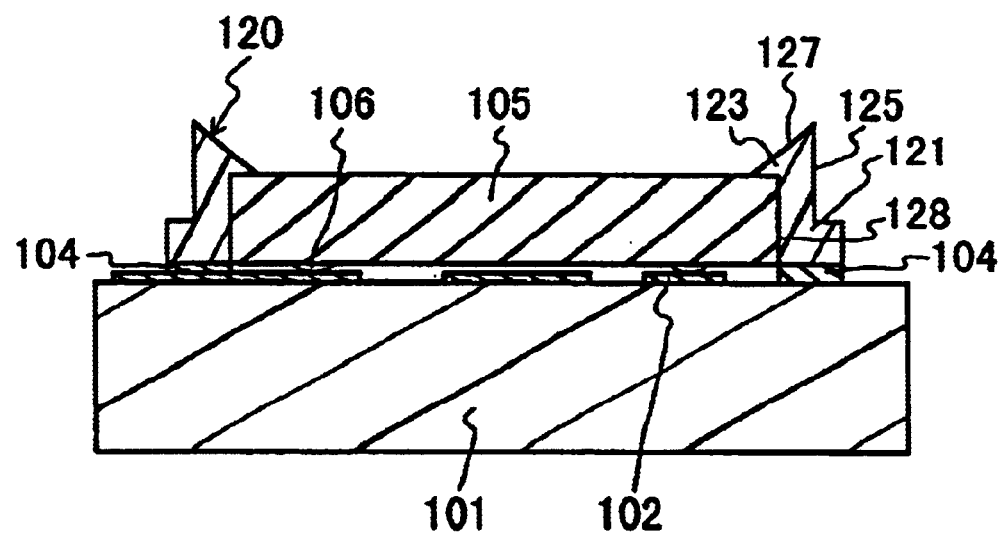
FIG. 1 is a sectional view showing an electronic-component mounted body according to a first embodiment of the present invention.

FIG. 1 is a sectional view of an electronic-component mounted body according to a first embodiment of the present invention.

In the present embodiment, a semiconductor bare chip (hereinafter referred to simply as a "semiconductor chip") 105 is placed on a circuit board 101 with a fixture 120 using the flip chip technique.

Electrodes 102 arranged in a predetermined pattern are provided on the surface of the circuit board 101. Practically, the circuit board 101 may be a multilayer circuit board in many cases, although this is not shown in the figure. In order to obtain wiring by providing electrodes 102 on the circuit board 101 corresponding to minute electrode pads arranged on the semiconductor chip 105 with a narrow pitch, the circuit board is required to be a multilayer circuit board. In an actual circuit board, a passive chip component such as a capacitor or a resistor may be placed peripherally, which also is not shown in the figure. Naturally, a semiconductor package also may be placed.

Bumps 106 are formed on the electrode pads of the semiconductor chip 105 by a known method.

In order to position and fix the semiconductor chip 105, a fixture 120 is fixed to the circuit board 101 using an adhesive 104. The fixture 120 is placed while being positioned accurately in relation to the positions of the electrodes 102 formed on the circuit board 101.

Figure 2:
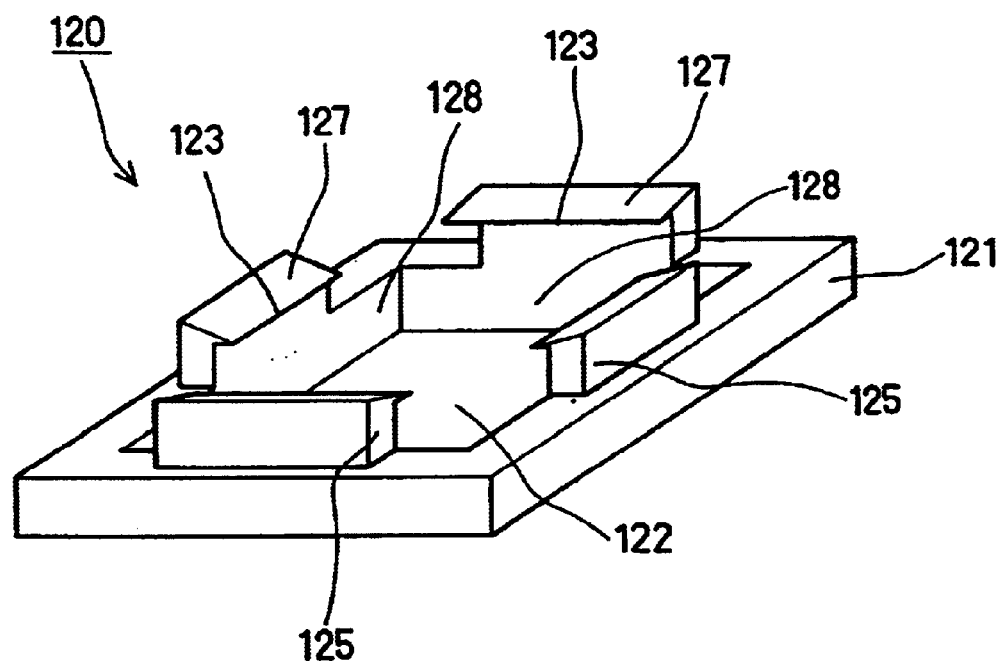
FIG. 2 is a perspective view showing a schematic configuration of a fixture according to the first embodiment of the present invention.

FIG. 2 is a perspective view showing a schematic configuration of the fixture 120.

The fixture 120 includes movable pawls 123, positioning walls 128, and a base 121 with a substantially rectangular frame-like shape. The movable pawls 123 fix the semiconductor chip 105 while pressing it toward the circuit board 101. The positioning walls 128 control the position of the semiconductor chip 105 in the direction parallel to the surface of the circuit board 101. The base 121 has an opening 122 in its center portion.

The movable pawls 123 are formed integrally with the four sides of the base 121 through thin-wall parts 125 having a relatively thin wall thickness, respectively. The tips of the movable pawls 123 project inward (on the side of the opening 122 where the semiconductor chip 105 is to be placed) from the positioning walls 128. The spaces between the tips of the opposed movable pawls 123 are narrower than the widths of the semiconductor chip 105. The movable pawls 123 fix the semiconductor chip 105 while holding the peripheral sides of the upper face of the semiconductor chip 105.

The upper portions of the movable pawls 123 are formed to have slopes 127 with their lower ends located on the opening 122 side. When the semiconductor chip 105 is to be attached, it only is necessary to place it on the slopes 127 and then to push it downward into the fixture 120. As the semiconductor chip 105 moves on the slopes 127, the thin-wall parts 125 are deformed elastically and the opposed movable pawls 123 move away toward the outside. Thus, the semiconductor chip 105 can be inserted. After the semiconductor chip 105 has been pushed into the fixture 120, the movable pawls 123 are restored. Thus, the semiconductor chip 105 is held and fixed by the movable pawls 123.

Preferably, the position in height of the movable pawls 123 is set so that the lower faces of the movable pawls 123 press the upper face of the semiconductor chip 105 downward with a predetermined force. This improves the reliability in the connections between the bumps 106 and the electrodes 102.

The position of the semiconductor chip 105 in the direction parallel to the surface of the circuit board 101 is controlled accurately through the contact of the peripheral walls of the semiconductor chip 105 with inner wall faces of the base 121, i.e. with two pairs of opposed positioning walls 128.

According to the above-mentioned configuration, the bumps 106 formed on the electrode pads of the semiconductor chip 105 contact with the electrodes 102 on the circuit board 101 formed in an exposed state inside the opening 122 of the base 121 with high position accuracy.

In the present invention, the configuration of the fixture 120 is not limited to that shown in FIG. 2 as long as the fixture 120 has the movable pawl 123 for fixing the semiconductor chip 105 and the positioning walls 128 for positioning the semiconductor chip 105. With respect to the movable pawl 123, four movable pawls may be provided to be located along the four sides of the semiconductor chip as shown in FIG. 2 or two movable pawls may be provided to be located along only two opposed sides. Alternatively, a number of movable pawls more than four may be provided. In addition, the movable pawls may be provided to hold not the sides of the semiconductor chip but only the four corners (or two opposed corners). When design consideration is given to the positions where the positioning walls 128 should be formed, it also is possible to reduce the number of the movable pawls 123 to one. On the other hand, with respect to the positioning walls 128, at least one pair of them opposing each other may be provided so as to pinch the semiconductor chip 105 from its both sides. The positioning walls 128 may be provided continuously to be located along the four sides of the semiconductor chip as shown in FIG. 2 or may be provided to be located along only two opposed sides of the semiconductor chip. Furthermore, the position walls 128 may be provided so as to come into contact not with the sides of the semiconductor chip but with only the four corners (or two opposed corners).

FIG. 2 shows an example of the fixture with four free corners where the movable pawls 123 are not formed. When such a fixture with four free corners is employed the respective four movable pawls 123 can move independently. Thus, excellent workability in attaching and removing the semiconductor chip can be obtained.

The movable pawls 123 corresponding to either the four sides or four corners of the semiconductor chip 105 are formed integrally with the base 121 with a substantially rectangular frame-like shape having an opening 122 in its center, preferably through the thin-wall parts 125. The thin-wall parts 125 facilitates the elastic displacement of the movable pawls 123.

The fixture 120 is formed with high precision so that the inner sizes between the opposed positioning walls 128 coincide with the outer sizes of the semiconductor chip 105. This allows the semiconductor chip 105 to be positioned accurately.

The base 121 is thicker in wall thickness than the thin-wall parts 125. This configuration provides a larger area of the bottom of the base 121 facing the circuit board 101 and thus a higher bond strength.

The base 121 can be formed to correspond to the four sides of the semiconductor chip 105 with a substantially rectangular planar shape. In this case, the base 121 may be formed to have continuous four sides as shown in FIG. 2 or may be provided with four sides independent of one another (i.e. separated from one another). The base 121 may include two separate parts each of which is formed of two adjacent sides connected to each other. However, the base 121 formed of one piece can be manufactured and attached easier and also can be manufactured at a lower cost. The base 121 also can be provided to be formed of independent parts corresponding not to the four sides of the semiconductor chip 105 but to the four corners (or two opposed corners) alone.

In the above-mentioned embodiment, the description was directed to the case where the bumps 106 were formed on the electrode pads of the semiconductor chip 105. However, the semiconductor chip 105 can be placed even when the bumps are not provided. Nevertheless, since the electrode pads of the semiconductor chip 105 are provided in portions slightly recessed from the surface of the semiconductor chip 105 in general, it is preferable to give support to the contact by forming bumps with plating or a conductive adhesive.

The use of the conductive adhesive gives an excellent result. In the case of forming the bumps 106, the conductive adhesive is applied between the bumps 106 and the electrodes 102 on the circuit board 101, so that excellent electrical contacts can be secured irrespective of surface irregularities of the circuit board 101 or variations in height of the bumps 106. This provides the following effects. That is, a pressing pressure applied by the movable pawls 123 for securing the contact can be reduced. In addition, it is no longer necessary to increase the mechanical strength of the base 121 and thus the base 121 can be formed to be smaller.

The material of the fixture 120 is not particularly limited. For instance, conductive materials such as metal, insulating materials such as resins or rubbers, or the like can be used. However, when the movable pawls 123 and the positioning walls 128, which come into contact with the semiconductor chip 105, are made of an insulating material, malfunction of the semiconductor chip 105 can be avoided. When the base 121, the movable pawls 123, and the positioning walls 128 are formed integrally using the same material, the fixture 120 can be manufactured at low cost. Particularly, it is preferable that the whole fixture 120 is formed integrally using resin, since the fixture 120 can have excellent formability and can be manufactured with high precision at low cost.

Second Embodiment

Figure 3:
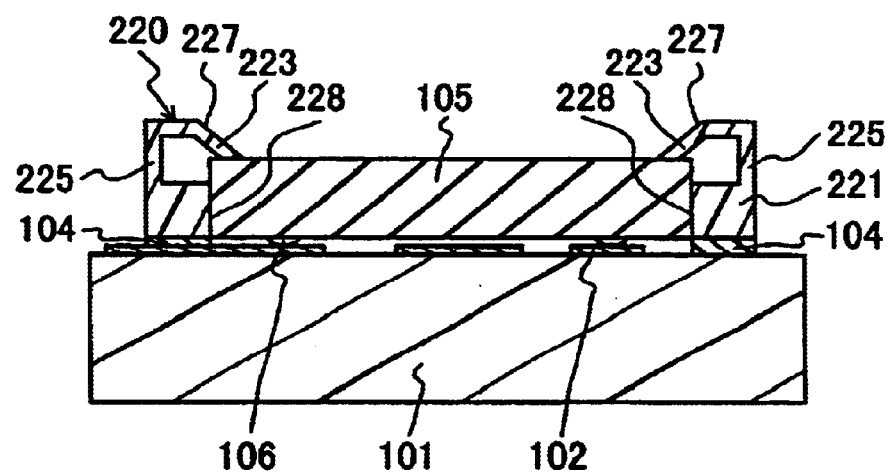
FIG. 3 is a sectional view showing an electronic-component mounted body according to a second embodiment of the present invention.
Figure 4:
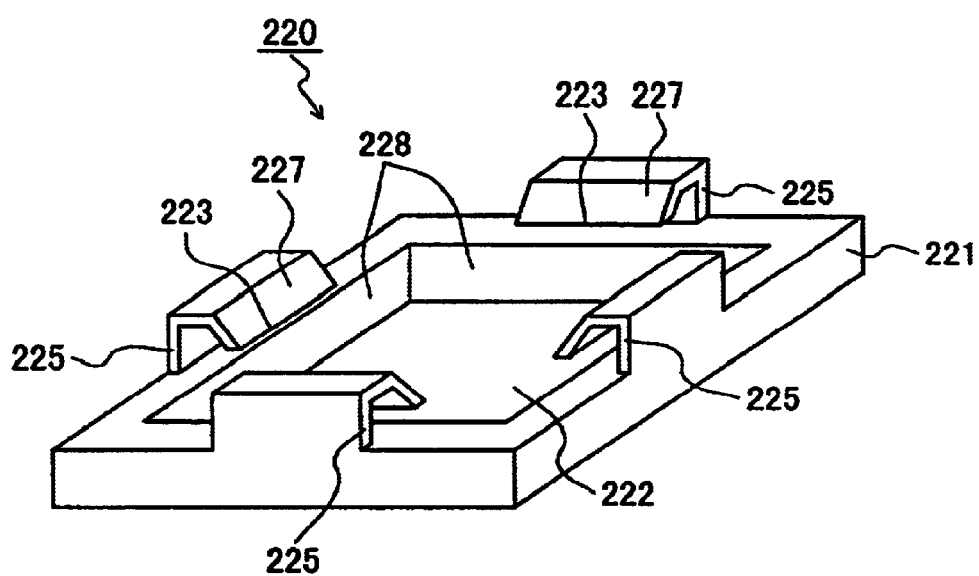
FIG. 4 is a perspective view showing a schematic configuration of a fixture according to the second embodiment of the present invention.

FIG. 3 is a sectional view of an electronic-component mounted body according to a second embodiment. FIG. 4 is a perspective view of a fixture used in the electronic-component mounted body shown in FIG. 3. In FIGS. 3 and 4, the same members as those shown in FIGS. 1 and 2 are indicated with the same numerals and their detailed descriptions are not repeated.

The second embodiment is different from the first embodiment in the shape of the fixture. The following description is directed to the fixture according to the present embodiment.

In FIGS. 3 and 4, numeral 220 indicates a fixture, numeral 221 a base, numeral 222 an opening, numeral 223 movable pawls, numeral 225 thin-wall parts, numeral 227 slopes, and numeral 228 positioning walls.

The thin-wall parts 225 of the fixture 220 according to the present embodiment are formed to have cross-sections bent in a substantially C-shaped form. One end of each thin-wall part 225 is connected to the base 221 and the movable pawl 223 is formed at the other end. An upper face of each thin-wall part 225 is formed to have a slope 227 with its lower end located on the side of the opening 222 where an electronic component 105 is to be placed.

The semiconductor chip 105 is attached in the same manner as in the first embodiment as follows. The semiconductor chip 105 is placed on the slopes 227 and then is pushed downward into the fixture 220. As the semiconductor chip 105 moves on the slopes 227, the thin-wall parts 225 are deformed elastically and the opposed movable pawls 223 move away toward the outside. After the semiconductor chip 105 has been pushed into the fixture 220, the movable pawls 223 are restored and press the upper face of the semiconductor chip 105 toward the circuit board 101. At the same time, the electrodes 102 formed to be exposed inside the opening 222 of the base 221 and the bumps 106 of the semiconductor chip 105 are connected to each other. The position of the semiconductor chip 105 in the direction parallel to the surface of the circuit board 101 is controlled accurately through the contacts of the peripheral walls of the semiconductor chip 105 with the inner wall faces of the base 221, i.e. with two pairs of opposed positioning walls 228.

In the second embodiment, the thin-wall parts 225 are formed to have a cross-section bent in a substantially C-shaped form. Consequently, the amount of displacement of the movable pawls 223 is increased. Consequently, even when the variations in accuracy are caused in the size of the space between the lower faces of the movable pawls 223 and the upper surface of the circuit board 101, in thickness of the semiconductor chip 105, or in height of the bumps 106, in flatness of the circuit board 101, or the like, such variations can be cancelled. Hence, the range of tolerance in their dimensions during the manufacture can be eased and thus the manufacturing cost can be reduced. In addition, the semiconductor chip 105 and the electrodes 102 can be prevented from being damaged due to excessive pressing force.

The cross-sectional shape of the thin-wall parts 225 is not limited to the substantially C-shaped form shown in FIG. 3, and for example, may be a substantially J- or V-shaped form. In addition, the cross-sectional shape may be a gently curved shape.

Except for the above descriptions, the same descriptions as in the first embodiment can be applied to the second embodiment.

Figure 5:
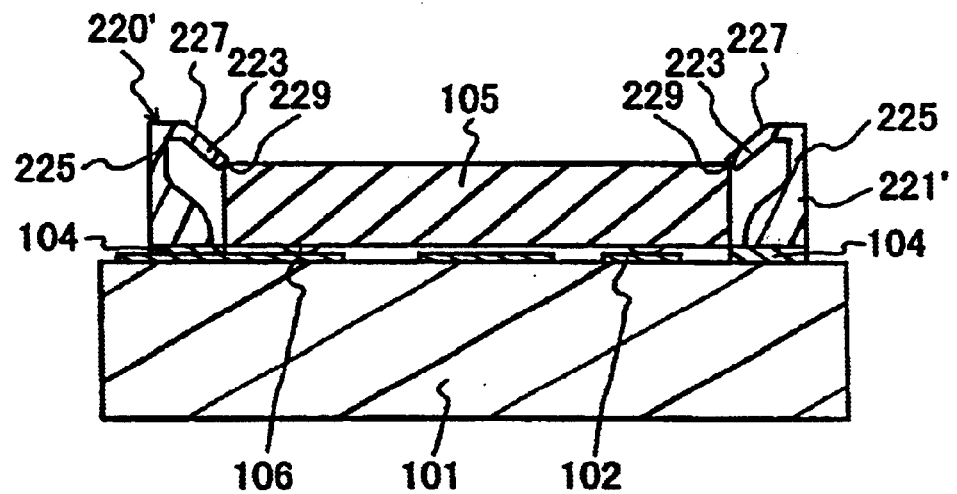
FIG. 5 is a sectional view showing another electronic-component mounted body according to the second embodiment of the present invention.

FIG. 5 is a sectional view of another electronic-component mounted body according to the second embodiment. In FIG. 5, the same members as those shown in FIG. 3 are indicated with the same numerals and their detailed descriptions are not repeated.

The mounted body shown in FIG. 5 is different from that shown in FIG. 3 in terms of the method of positioning the semiconductor chip 105 in the direction parallel to the surface of the circuit board 101. In the mounted body shown in FIG. 5, the semiconductor chip 105 is positioned as follows. The inner wall faces of a base 221' of a fixture 220' to be used in the mounted body shown in FIG. 5 do not come into contact with peripheral walls of the semiconductor chip 105 and do not contribute to the positioning of the semiconductor chip 105 at all. The semiconductor chip 105 is positioned using end faces 229 of movable pawls 223. The end faces (functioning as positioning walls in the present example) 229 are formed obliquely to the surface of the circuit board 101 and come into contact with peripheral sides of the upper face of the semiconductor chip 105. The force applied to the semiconductor chip 105 by the end faces can be divided into a force with a component in the direction orthogonal to the surface of the circuit board 101 (hereinafter referred to as an "orthogonal component force") and a force with a component in the direction parallel to the surface of the circuit board 101 (hereinafter referred to as a "parallel component force"). The orthogonal component force presses the semiconductor chip 105 toward the circuit board 101 and contributes to the connections between bumps 106 and electrodes 102. On the other hand, the parallel component force contributes to the control of the position of the semiconductor chip 105 in the direction parallel to the surface of the circuit board 101. In other words, the semiconductor chip 105 is positioned in a place where the pressing forces in the direction parallel to the surface of the circuit board 101 applied by a pair of opposed movable pawls 223 balance.

As described above, the position of the semiconductor chip 105 is controlled by the end faces 229 of the movable pawls 223. Consequently, even when manufacturing errors are caused in the outer dimension of the semiconductor chip 105 or in the formation position of the positioning walls, such errors can be cancelled through the elastic deformation of the thin-wall parts 225 supporting the movable pawls 223. Thus, such dimensional tolerance can be eased.

Third Embodiment

Figure 6:
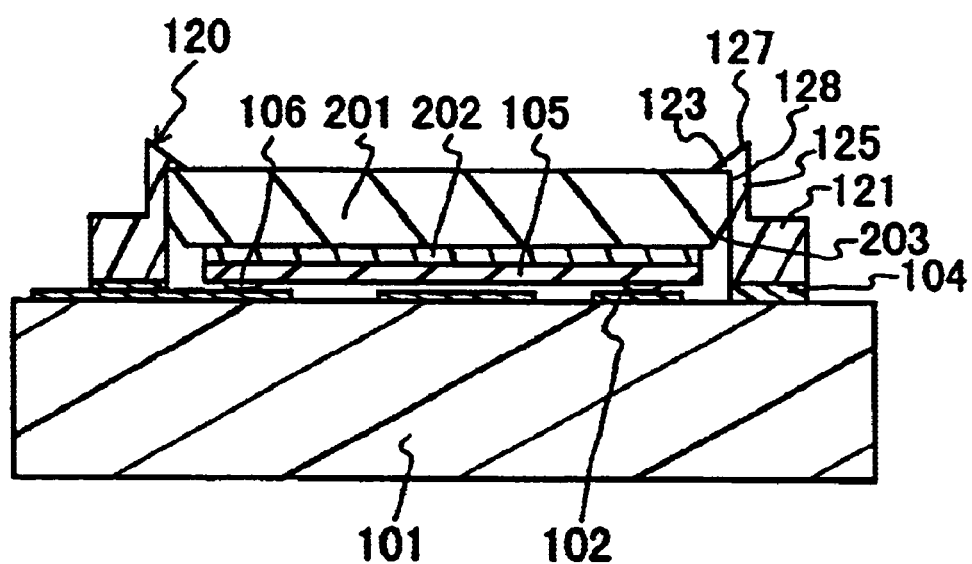
FIG. 6 is a sectional view showing an electronic-component mounted body according to a third embodiment of the present invention.

FIG. 6 is a sectional view of an electronic-component mounted body according to a third embodiment of the present invention. The members with the same functions as those of the members shown in FIG. 1 are indicated with the same numerals and their descriptions are not repeated.

A fixture 120 is fixed to a circuit board 101 according to the third embodiment with an adhesive 104 as in the first embodiment. A semiconductor chip 105 is placed on the circuit board 101 with the fixture 120 using the flip chip technique.

The third embodiment is different from the first embodiment in the following respects.

A fixing plate 201 is bonded to the semiconductor chip 105 by its opposite surface to the surface on which bumps 106 are formed, with an elastic buffer adhesive layer 202 having a predetermined thickness interposed therebetween. The fixing plate 201 has a larger planar shape than that of the semiconductor chip 105. The fixing plate 201 is combined with the semiconductor chip 105 while extending beyond the peripheral end of the semiconductor chip 105. The movable pawls 123 are allowed to hold the peripheral sides of the upper face of the fixing plate 201, so that the semiconductor chip 105 is attached to the fixture 120. The semiconductor chip 105 is positioned in the direction parallel to the surface of the circuit board 101 through the contacts of the peripheral walls of the fixing plate 201 with the positioning walls 128. Naturally, it is necessary to preset the relative positions of the semiconductor chip 105 and the fixing plate 201 accurately.

Thus, in the third embodiment, the semiconductor chip 105 is pressed and fixed indirectly by the movable pawls 223 through the fixing plate 201. The position of the semiconductor chip 105 is controlled indirectly by the positioning walls 128 through the fixing plate 201.

It is preferable to chamfer the periphery of the lower face of the fixing plate 201 to form a slope 203. This facilitates the insertion of the semiconductor chip.

Except for the above descriptions, the same descriptions as in the first embodiment shown in FIG. 1 can be applied to the present embodiment.

When the buffer adhesive layer 202 is provided between the fixing plate 201 and the semiconductor chip 105 as in the present embodiment, the pressing force of the movable pawls 123 is cancelled by the elastic deformation of the buffer adhesive layer 202. Thus, it is possible to ease the tolerance in accuracy in size of the space between the lower faces of the movable pawls 123 and the upper surface of the circuit board 101, in thickness of the semiconductor chip 105, or in height of the bumps 106, in flatness of the circuit board 101, or the like. In other words, such dimensional variations during the manufacture can be cancelled and thus the manufacturing cost can be reduced.

Elastic materials (for example, silicone rubbers or epoxy resins) can be used for the buffer adhesive layer 202.

As in the present embodiment, the semiconductor chip 105 is mounted using the fixing plate 201, so that the fixture 120 can be normalized. In order to minimize the manufacturing cost, there are provided no standardized shape, size, and area as the dimensions of the semiconductor chip 105. In the case of the first embodiment, therefore, special fixtures 120 corresponding to respective semiconductor chips must be prepared. However, when using the fixing plate 201, the number of sizes of the fixing plate 201 can be limited to a certain number. Thus, the types of the fixtures 120 can be reduced and the manufacturing cost can be reduced accordingly. This idea is identical with that of the standardization in packages such as a conventional QFP (quad flat package).

The use of the conductive adhesive allows excellent connections to be obtained reliably with a small pressing pressure, which is the same as in the first embodiment.

Fixtures with the same configurations as those described in the first and second embodiments can be used as the fixture 120. In the present embodiment, when the fixture 120 and the fixing plate 201 are formed to have shapes engaging with each other, the degree of freedom in the design of the shape of the fixture 120 increases as compared to the case of the first embodiment. For instance, the positioning walls 128 may be formed only on two opposed sides and the movable pawls 123 merely may be formed corresponding to the two positioning walls 128. The positioning walls 128 and the fixing plate 201 coming into contact therewith may be formed to have shapes engaging with each other (for example, a convex portion and a groove), so that the positioning in the direction parallel to the positioning walls 128 can be carried out.

Fourth Embodiment

Figure 7:
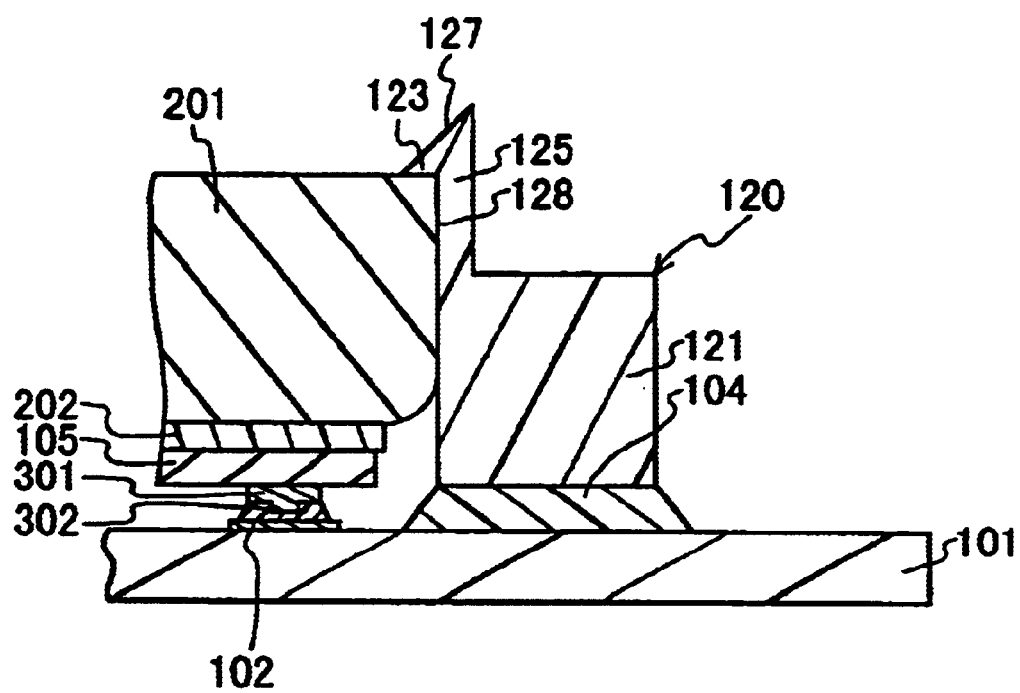
FIG. 7 is an enlarged sectional view showing a bonding portion between a bump and an electrode in an electronic-component mounted body according to a fourth embodiment of the present invention.

FIG. 7 is an enlarged sectional view showing a connection part of a bump and an electrode in an electronic-component mounted body according to a fourth embodiment of the present invention. The members with the same functions as those of the members shown in FIG. 6 are indicated with the same numerals and their descriptions are not repeated.

The fourth embodiment is different from the third embodiment in that a conductive adhesive 302 is interposed between a bump 301 on an electrode pad of a semiconductor chip 105 and an electrode 102 on a circuit board 101.

As in the third embodiment, a fixture 120 is bonded to the surface of the circuit board 101 with an adhesive 104. The semiconductor chip 105 is positioned with respect to and is bonded to a fixing plate 201 with a buffer adhesive layer 202 interposed therebetween. The fixing plate 201 is positioned accurately by positioning walls 128 of a base 121 and is fixed by movable pawls 123.

In the present embodiment, even when not all the tips of the bumps 301 can be brought into contact with the electrodes 102 due to poor flatness of the surface of the circuit board 101 or low formation accuracy of the bumps 301, the conductive adhesive 302 compensates for the gaps therebetween.

Even after the connection established using the conductive adhesive 302, replacement of the conductive chip 105 is possible. Usually, the electrical connection part has a very small area. Therefore, even when the conductive adhesive 302 has been cured, the adhesive strength is low and thus the semiconductor chip 105 can be removed easily. Naturally, the movable pawls 123 must be opened. After the removal of the semiconductor chip 105, the conductive adhesive 302 remains on the electrode 102 on the circuit board 101 only in a small amount and thus the conductive adhesive 302 can be removed easily even after being cured.

It also is possible to interpose the conductive adhesive between the bumps and electrodes as described above in the first embodiment.

It is preferable to check the electrical connection (a continuity test) between the semiconductor chip 105 and the circuit board 101 after the semiconductor chip 105 is placed on the circuit board 101 as in the above-mentioned first to fourth embodiments. When a poor connection is found as the result of the test, the movable pawls are displaced elastically, so that the semiconductor chip 105 can be removed easily. Therefore, repair is very easy.

When the good connection is found as the result of the test and the semiconductor chip 105 is not planned to be removed after that, it is preferable to inject an underfill between the semiconductor chip 105 and the circuit board 101. This prevents the connection part from deteriorating due to environmental variations and also increases the mechanical strength of the connection part. In addition to or instead of the injection of the underfill, the semiconductor chip 105 may be sealed with resin by a known method. This allows a semiconductor package to be obtained.

In the above-mentioned first to fourth embodiments, the descriptions are directed to the cases where the semiconductor chip 105 is mounted. However, a BGA or a CSP also may be mounted in the same manner instead of the semiconductor chip.

In the first to fourth embodiments described above, the descriptions are directed to examples in which the bumps 106 are formed on the electrode pads of the semiconductor chip 105. However, the bumps can be formed on the electrodes 102 on the circuit board 101.

In the first to fourth embodiments described above, solder bumps also can be used as the bumps 106. When using the solder bumps, it is preferable that a paste is applied to electrodes located on the side where the bumps are not formed. In this case, no conductive adhesive is required.

Jigs for a flip chip can be configured with the circuit boards with a fixture shown in the first to fourth embodiments. Specifically, electrodes are arranged in a lattice-point form on the lower face (a second surface) of the circuit board 101 (bumps or balls may be formed on electrodes as required), and then are connected electrically to the electrodes 102 on the upper surface (a first surface) through via holes or the like. Such a circuit board is placed on a mother board and the electrodes provided on the lower face are connected to the mother board. A jig for a flip chip thus obtained can be used as a jig for a CSP or BGA when a CSP or BGA is used instead of the semiconductor chip as the electronic component to be placed on the circuit board.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A fixture, comprising:
   a base with an opening in its center portion;
   a movable pawl provided on the base for fixing an electronic component; and
   a positioning wall for positioning the electronic component, the positioning wall extending continuously along four sides of the electronic component,
   wherein the positioning wall defines inner wall faces of the base, and
   the movable pawl has a surface that faces downward and is substantially parallel with a top face of the electronic component, the surface being brought into contact with the top face of the electronic component so that the electronic component is pressed toward the base.

2. The fixture according to claim 1, wherein the movable pawl is supported by the base through a thin-wall part having a relatively thin wall thickness so as to be in an elastically displaceable state.

3. The fixture according to claim 2, wherein a wall thickness of the base is thicker than that of the thin-wall part.

4. The fixture according to claim 2, wherein the thin-wall part has a cross-sectional shape bent or curved in a substantially C-, J-, or V-shaped form.

5. The fixture according to claim 1, wherein the base has a substantially rectangular frame-like planar shape with an opening in its center portion.

6. The fixture according to claim 5, wherein the movable pawl is formed at least on one side of four sides excluding four corners.

7. The fixture according to claim 1, wherein a slope with its lower end located on a side of the opening is formed on an upper portion of the movable pawl.

8. The fixture according to claim 1, wherein an end face of the movable pawl functions as the at least one pair of positioning walls.

9. The fixture according to claim 1, wherein the movable pawl and the at least one pair of positioning walls are formed of an insulating material.

10. The fixture according to claim 1, wherein the base, the movable pawl, and the at least one pair of positioning walls are formed integrally using the same material.

11. The fixture according to claim 1, wherein the movable pawl has a flat surface facing downward, the flat surface being brought into contact with the top face of the electronic component.

12. A circuit board with a fixture, comprising:
a fixture mounted on a circuit board, for placing an electronic component; and
electrodes formed on the circuit board with the fixture,
wherein the fixture comprises a movable pawl for fixing an electronic component and a positioning wall for positioning an electronic component, the positioning wall extending continuously along four sides of the electronic component,
the positioning wall defines inner wall faces of the fixture,
the electrodes are exposed between opposing portions of the positioning wall, and
the movable pawl has a surface that faces downward and is substantially parallel with a top face of the electronic component, the surface being brought into contact with the top face of the electronic component so that the electronic component is pressed against the electrodes.

13. The circuit board with a fixture according to claim 12, wherein the movable pawl is supported through a thin-wall part having a relatively thin wall thickness so as to be in an elastically displaceable state.

14. The circuit board with a fixture according to claim 13, wherein the fixture is fixed to the circuit board by adhering thereto by its bottom face, and
a wall thickness of the fixture at the bottom face is thicker than that of the thin-wall part.

15. The circuit board with a fixture according to claim 13, wherein the thin-wall part has a cross-sectional shape bent or curved in a substantially C-, J-, or V-shaped form.

16. The circuit board with a fixture according to claim 12, wherein the fixture has a substantially rectangular frame-like planar shape with an opening in its center portion.

17. The circuit board with a fixture according to claim 16, wherein the movable pawl is formed at least on one side of four sides excluding four corners.

18. The circuit board with a fixture according to claim 12, wherein a slope with its lower end located on a side where the electronic component is positioned is formed on an upper portion of the movable pawl.

19. The circuit board with a fixture according to claim 12, wherein the circuit board with a fixture has a first surface provided with the fixture and the electrodes and a second surface opposite to the first surface, and electrodes connected to the electrodes formed on the first surface are formed on the second surface.

20. The circuit board with a fixture according to claim 12, wherein the movable pawl has a flat surface facing downward, the flat surface being brought into contact with the top of the electronic component.

21. An electronic-component mounted body, comprising:
a circuit board with electrodes;
a fixture; and
an electronic component with electrodes,
the electronic component being placed on a circuit board using the fixture, and
bumps formed on the electrodes of the electronic component or on the electrodes on the circuit board,
wherein the fixture comprises a movable pawl and at least one pair of positioning walls,
the movable pawl fixes the electronic component to the circuit board,
the at least one pair of positioning walls control a position of the electronic component in a direction parallel to a surface of the circuit board with the electronic component placed therebetween,
the electrodes of the electronic component are connected to the electrodes on the circuit board formed between the at least one pair of positioning walls, and
the bumps and the electrodes on which the bumps are not formed are connected to each other with a conductive material interposed therebetween.

22. The electronic-component mounted body according to claim 21, wherein the movable pawl presses the electronic component toward the circuit board.

23. The electronic-component mounted body according to claim 21, wherein the electronic component is a semiconductor chip, a BGA, or a CSP.

24. The electronic-component mounted body according to claim 21, wherein the electrodes of the electronic component and the electrodes on the circuit board are connected to each other with a conductive adhesive interposed therebetween.

25. The electronic-component mounted body according to claim 21, wherein the bumps and the electrodes on which the bumps are not formed are connected to each other with a conductive adhesive interposed therebetween.

26. The electronic-component mounted body according to claim 21, further comprising a fixing plate with a larger outer dimension than that of the electronic component,
wherein the fixing plate is attached to the electronic component,
the movable pawl indirectly fixes the electronic component through the fixing plate, and
the at least one pair of positioning walls indirectly control a position of the electronic component through the fixing plate.

27. The electronic-component mounted body according to claim 26, wherein the fixing plate and the at least one pair of positioning walls are formed to have shapes engaging with each other, and with the shapes, a position of the fixing plate is controlled and/or the fixing plate is fixed.

28. The electronic-component mounted body according to claim 26, wherein a slope is formed at a periphery of a lower face of the fixing plate.

29. The electronic-component mounted body according to claim 26, wherein the fixing plate is attached to the electronic component with an elastic adhesive layer interposed therebetween.

30. A method of manufacturing an electronic-component mounted body, comprising:
providing a circuit board provided with a fixture and electrodes, the fixture having a moveable pawl and at least one pair of positioning walls, wherein the at least one pair of positioning walls are inner wall faces of the fixture,
the electrodes being formed to be exposed between the at least one pair of positioning walls; and connecting electrodes of an electronic component and the electrodes on the circuit board by fitting the electronic component between the at least one pair of positioning walls and fixing the electronic component by the movable pawl, and forming bumps on the electrodes of the electronic component or on the electrodes on the circuit board, the bumps and the electrodes on which the bumps are not formed are connected to each other with a conductive material interposed therebetween.

31. The method of manufacturing an electronic-component mounted body according to claim 30, further comprising conducting a continuity test for connections between the electrodes of the electronic component and the electrodes on the circuit board after connecting them.

32. The method of manufacturing an electronic-component mounted body according to claim 31, further comprising, after conducting the continuity test, injecting an underfill between the electronic component and the circuit board.

33. The method of manufacturing an electronic-component mounted body according to claim 31, further comprising, after conducting the continuity test, sealing the electronic component with resin.

* * * * *